United States Patent
Nakamura et al.

(10) Patent No.: US 8,530,916 B2
(45) Date of Patent: Sep. 10, 2013

(54) ORGANIC EL DEVICE

(75) Inventors: Masahiro Nakamura, Osaka (JP); Takeyuki Yamaki, Ikoma-gun (JP); Yoshio Mitsutake, Kashiba (JP); Masahito Yamana, Takarazuka (JP); Nobuhiro Ide, Katano (JP); Norihiro Ito, Osaka (JP); Hiroya Tsuji, Kyoto (JP)

(73) Assignee: Panasonic Corporation, Osaka (JP)

( * ) Notice: Subject to any disclaimer, the term of this patent is extended or adjusted under 35 U.S.C. 154(b) by 669 days.

(21) Appl. No.: 12/673,806

(22) PCT Filed: Aug. 25, 2008

(86) PCT No.: PCT/JP2008/065107
§ 371 (c)(1),
(2), (4) Date: Feb. 17, 2010

(87) PCT Pub. No.: WO2009/028456
PCT Pub. Date: Mar. 5, 2009

(65) Prior Publication Data
US 2011/0024779 A1 Feb. 3, 2011

(51) Int. Cl.
*H01L 33/00* (2010.01)
(52) U.S. Cl.
USPC .............. 257/98; 257/E51.018; 257/E33.068
(58) Field of Classification Search
USPC .............................. 257/98, E51.018, E33.068
See application file for complete search history.

(56) References Cited

U.S. PATENT DOCUMENTS

| 2003/0164496 A1 | 9/2003 | Do et al. |
| 2005/0142379 A1 | 6/2005 | Juni et al. |

(Continued)

FOREIGN PATENT DOCUMENTS

| CN | 1441629 A | 9/2003 |
| EP | 1 548 856 A2 | 6/2005 |

(Continued)

OTHER PUBLICATIONS

Supplementary European Search Report for the Application No. EP 08 82 8703 dated Aug. 31, 2010.

(Continued)

*Primary Examiner* — Tu-Tu Ho
(74) *Attorney, Agent, or Firm* — McDermott Will & Emery LLP (57) ABSTRACT

An organic EL device in the present invention comprises a light-transmissive substrate 1, an organic light emitting layer 2, a light-transmissive electrode 3 disposed between the light-transmissive substrate 1 and the organic light emitting layer 2, and a light guiding layer 4 which is disposed between the substrate 1 and the light-transmissive electrode 3. The light guiding layer 4 is configured to alter light direction. The organic EL device is configured to emit light from the organic light emitting layer 2, and allow the light to propagate out through said light guiding layer 4, the light-transmissive electrode 3, and the light-transmissive substrate 1. The light guiding layer 4 includes a light dispersion layer 5. The light dispersion layer 5 is formed with a light dispersion region 8 and a light-transmissive region 9, which are arranged in a coplanar relation within said light dispersion layer 5. The light dispersion region 8 contains light dispersion particles 6 and a binder resin 7. The light-transmissive region 9 contains the light dispersion particles 6 at a lower ratio than the light dispersion region 8. The organic EL device in the present invention enables to improve an overall light output by suppressing the reduction of light output in the front direction as well as increasing light output in diagonal directions.

21 Claims, 4 Drawing Sheets

(56) References Cited

U.S. PATENT DOCUMENTS

| | | |
|---|---|---|
| 2007/0114523 A1 | 5/2007 | Oumi et al. |
| 2007/0126353 A1 | 6/2007 | Kubota et al. |
| 2007/0290607 A1 | 12/2007 | Okada et al. |
| 2009/0072733 A1 | 3/2009 | Funayama et al. |

FOREIGN PATENT DOCUMENTS

| | | |
|---|---|---|
| JP | 2006-93019 A | 4/2006 |
| JP | 2006-286616 A | 10/2006 |
| JP | 2007-188708 A | 7/2007 |
| JP | 2007-188778 A | 7/2007 |
| JP | 2007-165284 A | 10/2007 |
| KR | 10-2007-0049182 A | 5/2007 |
| WO | WO-2006/035811 A1 | 4/2006 |

OTHER PUBLICATIONS

International Search Report for the Application No. PCT/JP2008/065107 mailed Nov. 25, 2008.

The First Office Action for the Application No. 200880104507.4 from State Intellectual Property Office of People's Republic of China dated Feb. 24, 2011.

Korean Office Action for the Application No. 10-2010-7006557 dated Jul. 21, 2011.

ORGANIC EL DEVICE

TECHNICAL FIELD

This invention relates to an organic EL device for utilized as liquid-crystal backlight, illumination device, various displays, and so on.

BACKGROUND ART

Organic EL device (organic electroluminescent device) has been developing as a typical surface illuminator. The organic EL device shown in FIG. 1(a) comprises a light-transmissive substrate 1, a light-transmissive electrode 3, an organic light emitting layer 2 made of an organic EL material, and a light-reflective opposing electrode 10, which are superimposed in this order. When receiving a voltage between the light-transmissive electrode 3 and the opposing electrode 10, the organic EL device emits light from the light emitting layer 2 to be output through the light-transmissive electrode 3 and the light-transmissive substrate 1.

Figure 1:
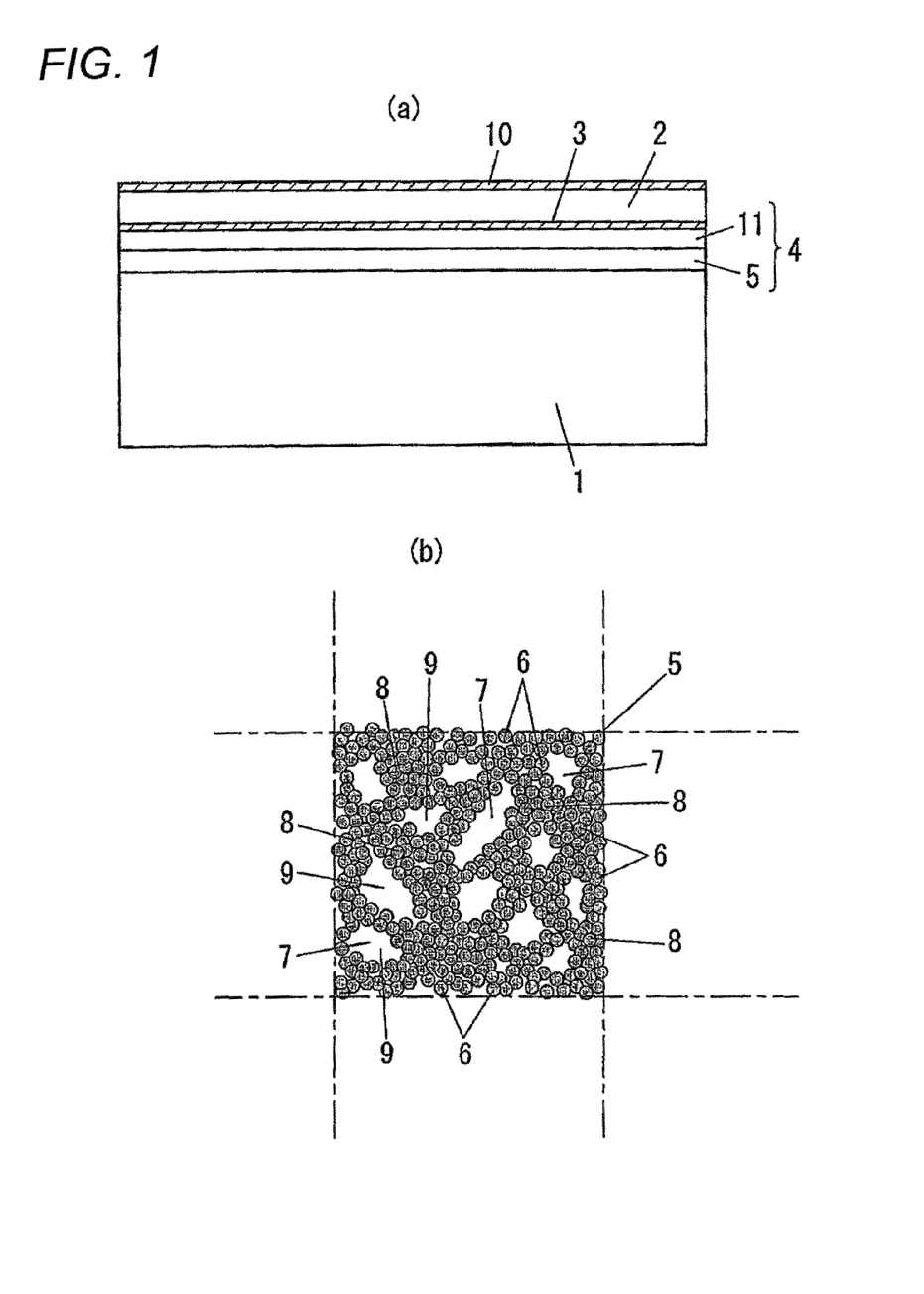

The organic EL device outputs the light which is emitted from the light emitting layer 2 through the light-transmissive electrode 3 and the light-transmissive substrate 1, but may decrease light output due to total reflection of light at an interface between the light-transmissive electrode 3 and the light-transmissive substrate 1. In view of this problem, the organic EL device is provided with a light dispersion layer 5 as shown in FIG. 1 (a), so as to improve light output by suppressing the total reflection of light at the interface between light-transmissive electrode 3 and the light-transmissive substrate 1.

The light-transmissive substrate 1 may be formed with a fine bumpy surface for acting as the light dispersion layer 5 opposite to the light-transmissive electrode 3. Instead, the light-transmissive substrate 1 may be provided at its surface opposite to the light-transmissive substrate 3 with a coating resin layer containing particles, as the light dispersion layer 5. In both cases, the light dispersion layer 5 has a bumpy surface, not allowing the thin light-transmissive electrode 3 to be formed with a uniform thickness. In view of the problem, the surface of the light dispersion layer 5 is provided thereon with a smoothing layer 11 having a smooth surface opposite to the light-transmissive electrode 3 in the organic EL device shown in FIG. 1 (a), allowing the light-transmissive electrode 3 to be formed with a uniform thickness (e.g., Japanese unexamined patent publication 2006-286616).

This organic EL device contains the light dispersion layer 5 and the smoothing layer 11, both of which define a light guiding layer 4 between the light-transmissive substrate 1 and the light-transmissive electrode 3. The light dispersion layer 5 of the light guiding layer 4 in this arrangement disperses the light emitted from the light emitting layer 2 toward other directions for improving light output by suppressing the total reflection of light at an interface between the light-transmissive electrode 3 and light-transmissive substrate 1.

As dispersing light in the light dispersion layer 5 of the light guiding layer 4, the organic EL device enables to increase light output in diagonal directions. But, this organic EL device decreases light output in the front direction, insufficiently increasing an overall light output.

The present invention is accomplished in view of this problem, and has an object to provide an organic EL device which enables to improve the overall light output by suppressing the reduction of light output in the front direction as well as increasing light output in diagonal directions.

DISCLOSURE OF THE INVENTION

An organic electroluminescent (EL) device in the present invention comprises a light-transmissive substrate 1, an organic light emitting layer 2, a light-transmissive electrode 3 disposed between the light-transmissive substrate 1 and the organic light emitting layer 2, and a light guiding layer 4 which is disposed between the substrate 1 and the light-transmissive electrode 3. The light guiding layer 4 is configured to alter light direction. The organic EL device is configured to emit light from the organic light emitting layer 2, and allow the light to propagate out through the light guiding layer 4, the light-transmissive electrode 3, and the light-transmissive substrate 1. The light guiding layer 4 includes a light dispersion layer 5. The light dispersion layer 5 is formed with a light dispersion region 8 and a light-transmissive region 9, which are arranged in a coplanar relation within the light dispersion layer 5. The light dispersion region 8 contains light dispersion particles 6 and a binder resin 7. The light-transmissive region 9 contains the light dispersion particles 6 at a lower ratio than the light dispersion region 8.

The organic EL device in the present invention emits light from the organic light emitting layer 2 and propagates out the light through the light dispersion layer 5 of the light guiding layer 4 and the substrate 1. This organic EL device enables to allow the light to pass through the light dispersion region 8 for being dispersed so as to increase light output in diagonal directions, as well as allowing the light to pass through the light-transmissive region 9 having a low content of the light dispersion particle so as to give light output in the front direction. With this arrangement, the organic EL device in the present invention enables to improve an overall light output by suppressing the reduction of light output in the front direction as well as increasing light output in diagonal directions.

In the present invention, the light dispersion region 8 preferably occupies 10 to 90 percent of planar area within the light dispersion layer 5.

The organic EL device in this arrangement enables to further suppress reduction of light output in the front direction and further increase light output in diagonal directions.

In the present invention, the light dispersion layer 5 preferably has a sea-islands structure, in which one of the light dispersion region 8 and the light-transmissive region 9 defines a sea, and the other of the light dispersion region 8 and the light-transmissive region 9 defines an island. The island preferably has a dimension of 1 to 100 µm.

The organic EL device in this arrangement is capable of suppressing the reduction of light output in the front direction as well as increasing light output in diagonal directions evenly in whole surface of the light dispersion layer 5.

In the present invention, each light dispersion particle 6 preferably has a diameter of 0.05 to 100 µm.

The organic EL device in this arrangement is capable of suppressing the reduction of light output in the front direction as well as increasing light output in diagonal directions without causing short-circuit.

In the present invention, each of the light dispersing particles 6 is preferably shaped into a non-circular configuration having a major axis and a minor axis.

The organic EL device in this arrangement enables to enhance the dispersion effect of light by the light dispersion particles 6, for further suppressing the reduction of light output in the front direction as well as further increasing light output in diagonal directions.

In the present invention, each of the light dispersing particles 6 is preferably light-reflective.

The organic EL device in this arrangement enables to enhance the light dispersion effect by the light dispersion particles 6, for further suppressing the reduction of light output in the front direction as well as further increasing light output in diagonal directions.

In the organic EL device of the present invention, it is preferable that the light guiding layer 4 is provided with a smoothing layer 11 between the light dispersion layer 5 and the light-transmissive electrode 3. The smoothing layer 11 preferably has a smooth surface.

The organic EL device in this arrangement allows the light-transmitting electrode 3 to be disposed on the smooth surface of the smoothing layer 11, without contact with a bumpy surface from which the dispersion particles 6 projects. It enables to form the light-transmissive electrode 3 having uniform thickness, without causing short-circuit at the light-transmissive electrode 3.

As described above, the organic EL device in the present invention emits light from the organic light emitting layer 2 and propagates out the light through the light dispersion layer 5 of the light guiding layer 4 and the substrate 1. This organic EL device enables to allow the light to pass through the light dispersion region 8 for being dispersed so as to increase light output in diagonal directions, as well as allowing the light to pass through the light-transmissive region 9 having a low content of the light dispersion particle so as to give light output in the front direction. With this arrangement, the organic EL device in the present invention enables to improve the overall light output by suppressing the reduction of light output in the front direction as well as increasing light output in diagonal directions.

BRIEF DESCRIPTION OF THE DRAWINGS

FIG. 1 shows (a) a schematic view of superimposed layers of an organic EL device and (b) a partially magnified view of a light dispersion layer surface of the organic EL device, in an example according to an embodiment of the present invention;

REFERENCE SIGNS LIST

| 1 | substrate |
| 2 | organic light emitting layer |
| 3 | electrode |
| 4 | light guiding layer |
| 5 | light dispersion layer |
| 6 | light dispersion particle |
| 7 | binder resin |
| 8 | light dispersion region |
| 9 | light-transmissive region |
| 10 | electrode |
| 11 | smoothing layer |

BEST MODE FOR CARRYING OUT THE INVENTION

Hereafter, explanations are given as to the best mode for carrying out the invention.

FIG. 1(a) shows an example of superimposed layers of an organic EL device of the present invention. This organic EL device includes a light-transmissive substrate 1, a light dispersion layer 5, a smoothing layer 11, a light-transmissive electrode 3, an organic light emitting layer 2, and an opposing electrode 10, which are superimposed in this order. The light dispersion layer 5 and the smoothing layer 11 defines a light dispersion layer 4 for altering light direction. The organic light emitting layer 2 may be provided with a hole injection layer and a hole transport layer in opposite to the light-transmissive electrode 3. The organic light emitting layer 2 may be provided with an electron injection layer and an electron transport layer in opposite to the opposing electrode.

The present invention is not limited to a specific light-transmissive material for utilized as the light-transmissive substrate 1. For example, the light-transmissive material 1 is made of a light-transmissive material such as transparent rigid glass plate (e.g., soda glass and non-alkali glass) and a flexible transparent plastic plate (e.g., polycarbonate and polyethylene terephthalate).

The light dispersion layer 5 can be formed into a film which is made of a coating material applied on the light-transmissive substrate 1. The coating material is prepared from light dispersion particles 6 and a binder resin 7.

Each of the light dispersing particles 6 may be a transparent particle such as $TiO_2$, $SiO_2$, $ZrO_2$, $Al_2O_3$, $Ta_2O_3$, $ZnO_2$, $Sb_2O_3$, $ZrSiO_4$, zeolite, porous substrate made of any of these particles, inorganic particles containing any of these particles, or organic particles (e.g., polyimide resin, acryl resin, styrene resin, polyethylene terephthalate resin, silicone resin, and fluoride resin).

The binder resin 7 may be polyethylene, polypropylene, polyethylene terephthalate, polymethylmethacrylate, polystyrene, polyethersulfo, polyarylate, polycarbonate resin, polyurethane, acryl resin, polyacrylnitrile, polyvinylacetal, polyamide, polyimide, diacrylphthalate resin, cellulose resin, polyvinylchloride, polyvinylidenechloride, polyvinylacetate, any other thermoplastic resin, or any copolymer composed of plural monomers each of which forms any of these resins. The binder resin 7 may be silicone resin reacted with silicate alkoxide, silica porous including polysiloxane. This polysiloxane can be obtained through condensation polymerization of alkoxysilane (e.g., tetraethoxysilane) or a partially hydrolyzed alkoxysilane.

In general, the difference in refractive index between the binder resin 7 and the light dispersion particles 6 is preferably in the range of 0.01 to 2. Otherwise, the light dispersion layer may not sufficiently increase light output either due to lack of effective Mie dispersion when the difference in refractive index is too small, or due to increase in backward scattering when the difference in refractive index is too large.

The light refractive layer 5 can be formed of two light dispersion particles 6 with different refractive indexes of $Nf_1$ and $Nf_2$. The two light dispersion particles 6 and the binder resin 7 (refractive index: Nb) are selected to satisfy a relation of $Nf_2 > Nb > Nf_1$, for the purpose of improving light refraction effect as well as changing critical angles at interlace between the light dispersion layer 5 and the light-transmissive substrate 1 so as to effectively guide light toward the light-transmissive substrate 1, eventually improving light output.

In general, the binder resin 7 is selected to have a refractive index Nb of 1.45 to 1.60, and the light dispersion particles 6 are selected to have refractive indexes $Nf_1$ and $Nf_2$ of 1.2 to 2.5. One of the light dispersion particles 6 is generally selected to have a refractive index of 1.2, but not particularly limited to the value. One of the light dispersion particles 6 is preferably selected to have a refractive index of 1.4 or less for providing a highly light-dispersive light dispersion layer 5 with significantly decreased refractive index. In this case, the light dispersion particles 6 are preferably selected such that the difference between two light refractive indexes $Nf_1$, $Nf_2$ is 0.5 or more, for prompting the light dispersion in the light dispersion layer 5, so as to achieve a further improved light output. The maximum of difference between the two light refractive indexes of the light dispersion particles 6 is not particularly limited to a specific value, but preferably set at 1.3 or less. The mixing ratio of the two light dispersion particles 6 is not particularly limited to specific ranges, but preferably set at 1:9 to 9:1 in mass.

The coating material contains the light dispersion particles 6 and the binder resin 7, and is applied on the substrate 1 by spincoat, dipcoat, diecoat, cast, spray coat, grabia coat to form the light dispersion layer 5.

Thickness of the light dispersion layer 5 is not particularly limited to specific ranges, but preferably set in a range of 0.1 to 20 μm. The light dispersion layer 5 is generally set to have a refractive index of 1.30 to 1.70, but preferably set to have the same refractive index as the light-transmissive substrate 1 or less, in order to hinder total reflection of light at an interface between the light dispersion layer 5 and the light-transmissive substrate 1, thereby giving a further improved light output. The light dispersion layer 5 is preferably set to have a haze factor ((diffusive transmittance/total transmittance)×100) of 2 to 50, for improving light output. Otherwise, the light dispersion layer 5 may be whitened to lose its external appearance when the haze factor is too high, although improving the light output.

In preparation for the coating material to be applied on the light-transmissive substrate 1, it is necessary to suitably select substances for the light dispersion particles 6 and binder resin 7 to be mixed with each other, and specifically control the mixing ratio, such that the light dispersion particles 6 are allowed to aggregate with, each other by their surface energies to form light dispersion regions 8 and subsequently migrate through the binder resin 7 as solvent vaporizes. As a result, the light dispersion layer 5 is formed with the light dispersion regions 8 containing many aggregated light dispersion particles 6, and light-transmissive regions 9 containing the light dispersion particles 6 at a lower ratio than the light dispersion region 8, which are respectively arranged in a coplanar relation. As shown in FIG. 1 (*b*), the light dispersion layer 5 is formed with the light dispersion region 8 containing many light dispersion particles 6 and the light-transmissive region 9 containing fewer light dispersion particles 6 than the light dispersion region 8, and designed to have a sea-islands structure in which one of the light dispersion region 8 and the light-transmissive region 9 defines a sea, and the other defines an island, and the light dispersion region 8 and the light-transmissive region 9 are sporadically spread evenly in a coplanar relation within the light dispersion layer 5.

In order to control the dimension ratio of light dispersion region 8 and the light-transmissive region 9 within the light dispersion layer 5, it is necessary to suitably determine the mixing ratio of substances for the light dispersing particles 6 and binder resin 7, a quantity of solvent for dilution of the coating material to have a specific concentration of the light dispersing particle 6, or the number of repetitive application of the coating material to form the light dispersion layer 5. It is preferable that the light dispersing particles 6 is set to have a concentration of 10 percent of weight or less by the dilution of the coating material with solvent, so as to form the light dispersion layer 5 having a distinctive sea-islands structure defined by the light dispersion layer 8 and the light-transmissive region 9. The light dispersion region 8 is preferably controlled to contain twice as many the light dispersion particles 6 as the light-transmissive region 9 or more. More preferably, the light-transmissive region 9 is controlled to contain no light dispersing particles 6. Otherwise, the light dispersion layer 5 may not sufficiently suppress the reduction of light output in the front direction, as well as insufficiently improving light output in diagonal directions.

The light dispersion particles 6 in this arrangement makes bumpy the surface of the light dispersion layer 5 by projecting therefrom. When being formed on the bumpy surface of the light dispersion layer 5, the thin light-transmissive electrode 3 may have uneven thickness as well as many bumps formed along the bumpy surfaces of the light dispersion layer 5, eventually causing electrical problems such as short-circuit. The electrical problems in this configuration are highly possible particularly when the light dispersion layer 5 has a developed bumpy surface, either due to the light dispersion layer 5 which is formed with the light dispersion region 8 and the light-transmissive region 9 as in the present invention, or due to noncircular-shaped light dispersing particles 6 having a major axis and a minor axis. In order to overcome this problem, the light dispersion layer 5 is provided at its surface remote from the substrate 1, with a smoothing layer 11 having a smooth surface. Then, the light-transmissive electrode 3 is formed on the smoothing layer 11 to be in contact with its smooth surface.

The smoothing layer 11 may formed of a resin coating layer. The coating resin material can be formed of any light-transmissive material such as polyester, polyether, polyetherketone, polyimide, polyamide, polyimideamide, epoxy, polyurethane, polyurethaneacrylate, polycarbonate. The coating resin layer 11 is preferably formed of a thermosetting resin such as polyimide, polyamideimide, epoxy, and polyurethane. The coating resin is applied on the surface of the light dispersion layer 5, and then cured by heating to act as the smoothing layer 11. Thickness of the smoothing layer 11 is not particularly limited to specific ranges, but preferably set at 1 to 20 μm. Planarity of a surface of the smoothing layer 11 is defined as a calculated mean roughness Ra (JIS B0601), which is measured by using contact-type film thickness meter (available as "Dektak 6" from ULVAC Inc.) in measurement distance of 5000 μm, load of 0.5 mg, measurement time of 20 sec. The calculated mean roughness is preferably 200 nm or less, more preferably 50 nm or less, but not particularly limited to the values.

The resin forming the smoothing layer 11 is preferably selected to have a refractive index larger or marginally smaller than that of the light-transmissive electrode 3, for suppressing a light total reflection at an interface between the light-transmissive electrode 3 and the smoothing layer 11 such that the light is efficiently directed toward the light dispersion layer 5. The resin forming the smoothing layer 11 is preferably selected to have a refractive index larger or marginally smaller than that of the light dispersion layer 5. Ideally, the smoothing layer 11 has a refractive index gradually greater or lower toward the light dispersion layer 5 from the light-transmissive electrode 3, so as to allow the refractive index to change continuously from the light-transmissive electrode 3 to the light dispersion layer 5, for the purpose of suppressing the light total reflection at an interface between the smoothing layer 11 and the light dispersion layer 5 as well as the interface between the smoothing layer 11 and the light-transmissive electrode 3.

As mentioned above, the smoothing layer 11 is provided on a surface of the light dispersion layer 5. Then, the light-transmissive electrode 3 is formed on the smoothing layer 11 to be remote from the light dispersion layer 5. The light-transmissive electrode 3 is formed of any material for achieving effects of the present invention, such as indium-tin-oxide (ITO), indium-zinc-oxide (IZO), tin oxide, an extremely thin film of metal such as Au, an electrically conductive polymer, an electrically conductive organic material, an organic layer containing dopant (donor or acceptor), a mixture of an electrically conductor and an electrically conductive organic material (including polymer), or a laminate containing any of these compounds. The light-transmissive electrode 3 can be formed as a film containing any of these materials by vapor growth method (e.g. spattering method, ion-plating method). Thickness of the light-transmissive electrode 3 is not particularly restricted to specific ranges, but preferably set in a range of 50 to 300 nm.

After formed on the smoothing layer 11, the light-transmissive electrode 3 is provided at its surface far from the smoothing layer 11, with the light emitting layer 2. The light emitting layer 2 may be formed of an organic EL material such as anthracene, naphthalene, pyrene, tetracene, coronene, perylene, phthaloperylene, naphthaloperylene, diphenylbutadiene, tetraphenylbutadiene, coumarin, oxadiazol, bisbenzoxazorine, bisstyryl, cyclopentadiene, coumarin, oxadiazol, bisbenzoxazorine, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri(p-terphenyl-4-yl)amine, pyrane, quinacridone, rubrene, derivatives of any of these compounds, 1-aryl-2,5-di(2-thienyl)pyrrole derivative, distyrylbenzene derivative, styrylarylene derivative, styrylamine derivative, or a compound (or a polymer) containing any of these luminescent materials. The light emitting layer 2 may be formed of a fluorescent material, a phosphorescent material (e.g., Ir complex, Os complex, Pt complex, Eu complex), or a compound (or a polymer) containing any of these fluorescent/phosphorescent materials. These materials may be optionally employed.

The light emitting layer 2 is provided at its surface remote from the light-transmissive electrode 3, with the light-reflective opposing electrode 10, to form the organic EL device shown in FIG. 1(*a*). The opposing electrode 10 may be formed of a metal (e.g., Al), or a laminate containing Al and any other metal. The light emitting layer may be formed of a laminate of alkali metal and Al, a laminate formed of alkali metal and Ag, a laminate formed of alkali metal halogenate and Al, a laminate formed of alkali metal oxide and Al, a laminate formed of alkali earth metal (or rare earth metal) and Al, or an alloy containing any of these metals and any other metal (e.g., Na, Na—K alloy, Li, Mg(or other)-Al laminate, Mg—Ag mixture, Mg—In mixture, Al—Li alloy, LiF/Al mixture/laminate, and Al/$Al_2O_3$ mixture).

When receiving voltage applied between the light-transmissive electrode 3 and the opposing electrode 10, the organic EL device formed according to the above procedure is enabled to emit light from the organic light emitting layer 2, allowing the light to pass through the light guiding layer 4 composed of the smoothing layer 11 and the light dispersion layer 5, subsequently radiating outwardly the light through the light-transmissive substrate 1. The organic EL device in this arrangement enables to scatter the light passing through the light dispersion layer 5 of the light guiding layer 4 toward other directions, so as to suppress the light total reflection at an interface between the light extraction layer 4 and the light-transmissive substrate 1.

The light dispersion layer 5 has a sea-islands structure, and is formed with a light dispersion region 8 and a light-transmissive region 9, which are arranged in a coplanar relation within the light dispersion layer 5. Each of the light dispersion region 8 and the light-transmissive region 9 contains light dispersion particles 6 and a binder resin 7. The light-transmissive region 9 contains the light dispersion particles 6 at a lower ratio than said light dispersion region 8. The light dispersion layer 5 in this arrangement enables to scatter light passing through dispersion region 8 by the light dispersion particles 6 to increase light output in diagonal directions, as well as permitting the light to pass through the light-transmissive region 9 without scattering for lack of light dispersion particles 6 such that the light is efficiently radiated in the front direction. Therefore, the organic EL device in this arrangement enables to suppress the reduction of the light output in the front direction, as well as increasing the light output in diagonal directions, so as to improve overall light output.

In the light dispersion layer 5 of a sea-islands structure defined by the light dispersion region 8 and the light-transmissive region 9, the light dispersion region 8 is preferably set to occupy 10 to 90 percent of planar area within the light dispersion layer 5. Otherwise, the overall light output may not sufficiently increase, either because the light dispersion layer 5 insufficiently increases light output in diagonal directions due to lack of scattering of the light passing through the light dispersion layer 5 when the light dispersion region 8 occupies less than 10 percent thereof, or because the light dispersion layer 5 substantially decreases the light output in the front direction, rather than substantially increasing light output in diagonal directions, due to lack of the light-transmissive region 9 when the light dispersion region 8 occupies more than 90 percent thereof.

When the light dispersion layer 5 has a sea-islands structure in which the light dispersion region 8 defines a sea; the light-transmissive region 9 defines an island, each light-transmissive region 9 defining island is preferably controlled to have a dimension of 1 to 100 μm. Otherwise, the overall light output may not sufficiently increase, either due to lack of light output in diagonal directions instead of substantial increase of light output in the front direction when the light-transmissive region 9 has a dimension of more than 100 μm, or due to lack of light output in the front direction when the light-transmissive region 9 has a dimension of less than 1 μm. In contrast, when the light dispersion layer 5 has a sea-islands structure in which the light dispersion region 8 defines an island; the light-transmissive region 9 defines a sea, the light dispersion region 8 is preferably controlled to have a dimension of 1 to 100 μm. Otherwise, the overall light output may not sufficiently increase, either due to lack of light output in the front direction instead of substantial increase of light output in diagonal directions when the light dispersion region 8 has a dimension of more than 100 μm, or due to lack of light output in diagonal directions when the light dispersion region 8 has a dimension of less than 1 μm. In both cases, the island having a dimension of more than 100 μm may unevenly distribute the light dispersion region 8 and light-transmissive region 9, thereby unevenly suppressing the light output in the front direction as well as unevenly improving the light output in diagonal directions throughout whole surface of the light dispersion layer 5. The dimension of the light dispersion region 8 and the light-transmissive region 9 is defined as a mean length of diameters in all directions.

Each of light dispersion particles 6 forms the light dispersion region 8 and the light-transmissive region 9 of the light dispersion layer 5, and preferably has a diameter (mean diameter) of 0.05 to 100 µm. Otherwise, the light dispersion layer may not sufficiently increase the light output due to lack of the light dispersion when the light dispersion particle has a dimension less than 0.05 µm, or may lose device reliability due to short-circuit which derives from the light dispersion particles 6 projecting into other layers forming the organic EL device when the light dispersion particle has a dimension more than 100 µm. The mean diameter of the light dispersion particles 6 is defined as a mean value of diameters which are measured three times by Fiber-optics particle analyzer (available from Otsuka Electronics Co. Ltd.) for particles dispersed into solution.

The light dispersion particles 6 may be circular configuration such as spherical shape, or non-circular configuration having a major axis and a minor axis. The non-circular-shaped light dispersion particles 6 can be aligned such that their major axes are inclined toward various directions at various angles in relation to thickness direction of the light dispersion layer 5, for improving light dispersion effect. For example, the light dispersion particles 6 may have convex lens shape which has a major diameter of 5 µm and a minor diameter of 3 µm, or spherical shape having a diameter of 5 µm. When the light dispersion layer 5 is applied on a surface of the substrate 1 without particular treatments, the convex-shaped light dispersion particles 6 can be arranged such that their major axis are irregularly aligned in various directions, rather than regularly aligned in one direction, thereby giving the light dispersion effect in the various directions, compared to the spherical light dispersion particles 6. Namely, the non-circular shaped light dispersion particles 6 can substantially increase light output in diagonal directions, as well as substantially suppressing the reduction of light output in the front direction.

Each of the light dispersion particles 6 is not required to have orthogonal main and minor axes, but may have non-orthogonal main and minor axes which are crossed at an arbitrary angle. As described above, each of the non-spherical light dispersion particles 6 preferably has diameters along major and minor axes of 0.05 to 100 µm, more preferably has a diameter along major axis of 0.5 to 50 µm and a diameter along minor axis of 0.1 to 10 µm. The ratio of diameter along major axis to that along minor axis is preferably in a range of 1.2 to 5, but not limited to this range.

Each light dispersion particle 6 preferably has a light-reflective surface. The light-reflective light dispersion particle 6 gives a high light dispersion effect, thereby substantially suppressing the reduction of light output in the front direction as well as substantially improving the light output in diagonal directions.

Each of the light-reflective light dispersion particles 6 is not required to be formed of a specific material, but may be formed of a particle of metal such as Al.

EXAMPLES

Explanations are given as to examples of the present invention. Weight-average molecular weight was obtained as a calibrated value which was determined based on experimental data using "HLC-8120" (available from Tosoh Co. Ltd.) as GPC (Gel permeation chromatography) and a calibration line obtained using standard polystyrene.

Example 1

86.8 parts by weight of tetraethoxysilane, 34.7 parts by weight of γ-methacrylloxypropyltrimethoxysilane, and 75 parts by weight of 0.1N-nitric acid were added to 803.5 molecular weight of isopropylalcohol, and then sufficiently mixed with each other by using disper to give a solution. The resultant solution was stirred for two hours with being kept in thermostat bath at 40° C., giving 5-percent solution by weight of silicone resin having a weight-average molecular weight of 1050. Subsequently, the silicone resin solution was mixed with methylsilicone particles (available from GE Toshiba silicone Co. Ltd as "Tospal 120" having a mean diameter of 2 µm) as light dispersion particles 6, such that the ratio of methylsilicone particles/silicone resin was controlled at 80/20 in weight of solid content (a corresponding value of condensed compound, provided that Si is substituted with $SiO_2$ in tetraalkoxysilane or with $SiO_{1.5}$ in trialkoxysilane). The resultant mixture was dispersed by use of homogenizer to give a silicone resin solution dispersed with methylsilicone resin particles as a coating material.

A non-alkali glass plate (available from Coaning Inc. as "No. 1737") was employed as a light-transmissive substrate 1. The above coating material was applied on a surface of the light-transmissive substrate 1 by use of spin coater rotating at 1000 rpm and then dried, repeatedly six times. The resultant plate was sintered at 200° C. for 30 minutes to provide a light dispersion layer 5 having a thickness of 5 µm. The light-transmissive substrate 1 provided with the light dispersion layer 5 was measured using haze mater (available from Nippon Denshoku Industries Co., Ltd. as "NDH-2000"), revealing its haze value and its total light beam transmission are 95.4 and 73.4 percent, respectively.

Figure 2:
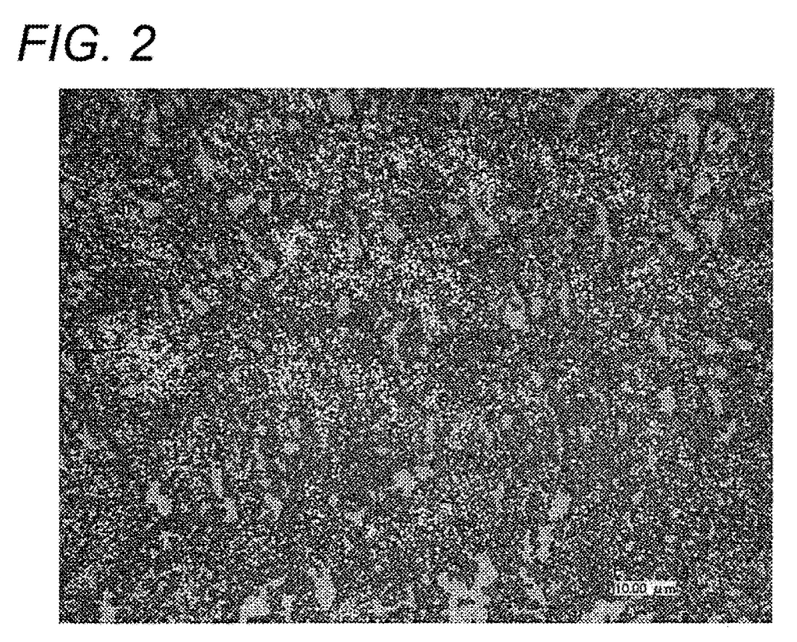
FIG. 2 shows an optical microscopic photograph of the light dispersion layer surface in example 1 of the organic EL device in the present invention, with 500-fold magnification.

The surface of light dispersion layer 5 prepared according to the above procedure was observed by using optical microscope (available from Keyence Corp. as "VHX-500"). FIG. 2 shows an optical microscopic photograph of the surface of this light dispersion layer 5, with 500-fold magnification. As shown in FIG. 2, this light dispersion layer 5 has a sea-islands structure in which a light dispersion region 8 dispersed with the light dispersion particles 6 defines a sea; a light-transmissive region 9 not containing light dispersion particles 6 defines islands. The light-transmissive region 9 forming each island has a dimension of 100 µm or less. The light dispersion region 8 occupies about 70 percent of the light dispersion layer.

Imide resin coating material (available from OPTMATE Corp. as "HRI 1783": nD=1.78, 18 percent in weight concentration) was applied on the light dispersion layer 5 by use of spin-coater rotating at 2000 rpm, then dried, and subsequently cured by heating at 200° C. for 30 minutes to provide a smoothing layer 11 having a thickness of 4 µm.

With the use of ITO target (available from Tosoh Corp.), an ITO film having a thickness of 120 nm was formed by spattering on a surface of the smoothing layer 11 which was prepared according to the above procedure. The ITO film provided on the substrate 1 was heated at 200° C. for one hour in Ar-atmosphere so as to be annealed, providing a transparent electrode having a sheet resistance of 18 ohms per square as an electrode 3.

The substrate 1 provided with the transparent electrode 3 was ultrasonically washed with acetone, pure water, and isopropylalcohol for 15 minutes, then dried, and subsequently subjected to UV-$O_3$ treatment for 15 minutes. After the substrate 1 being set in a vacuum deposition apparatus, the electrode 3 was provided thereon with N,N'-diphenyl-N,N'-bis(1-naphthyl)-1,1'-biphenyl-4,4'-diamine (NPB) (available from eRay Co. Ltd.) having a thickness of 40 nm as a hole transport layer, Al-tris(8-hydroxyquinoline) (Alq) (available from eRay Co. Ltd.) having a thickness of 60 nm as an electron transport layer of the light emitting layer 2, LiF (available from Kojundo chemical Co. Ltd.) having a thickness of 1 nm as an electron injection layer, which were superimposed in this order. Subsequently, an Al film (available from Kojundo chemical Co. Ltd.) having a thickness of 80 nm was deposited on the electron injection layer of the laminate in vacuum as an opposing electrode (cathode) 10.

The substrate 1 with the laminate which is formed by deposition according to the above process was transferred into a glove box in dried nitrogen atmosphere at −80° C. or less, without exposure to air. In advance, a water-absorbent (available from Dynic Corp.) was adhered to a glassy sealing cap, which was applied at its rim with a sealing agent made of UV curing resin. With being kept inside the glove box, the substrate 1 was attached to the sealing cap with the sealing agent such that each layer was covered with the sealing cap, and then subjected to UV-irradiation to cure the sealing agent for encapsulating each layer therewith, so as to provide an organic EL device shown in FIG. 1 (*a*).

Example 2

Figure 3:
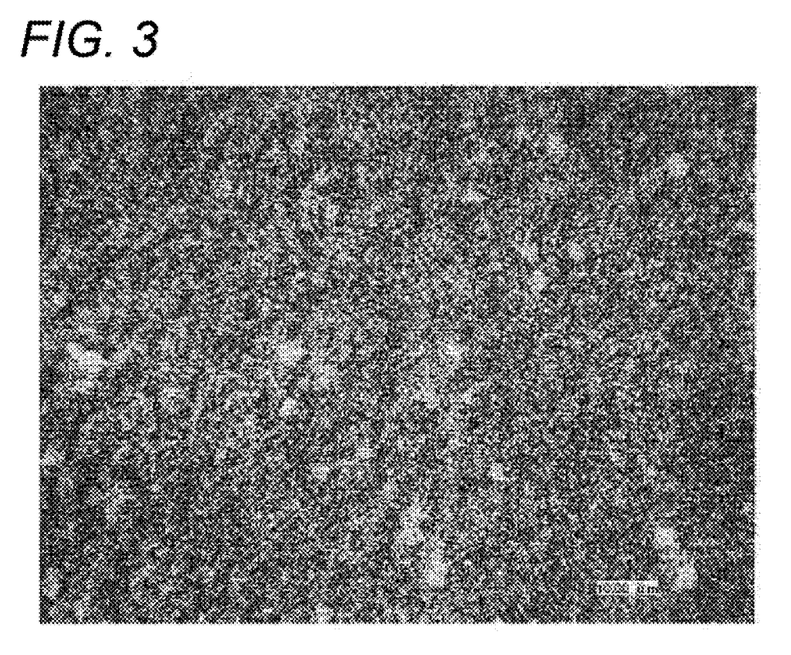
FIG. 3 shows an optical microscopic photograph of the light dispersion layer surface in example 2 of the organic EL device in the present invention, with 500-fold magnification.

The coating material was applied on the substrate 1 by spin-coater and then dried in the same way as in Example 1 repeatedly ten times to form the light dispersion layer 5. Thickness of the light dispersion layer 5 was measured by using contact surface profilometer (available from Japan Veeco Co. Ltd. as "DekTak3"). The mean thickness of the light dispersion layer 5 is about 8 μm. The surface of this light dispersion layer 5 was observed by using optical microscope (available from Keyence Co. Ltd. as "VHX-500"). FIG. 3 shows an optical microscopic photograph of surface of this light dispersion layer 5, with 500-fold magnification. As shown in FIG. 3, the light dispersion particles 6 almost wholly occupy within the light dispersion layer 5 (the light-transmissive region 9 has a dimension of less than 1 μm). The light dispersion layer 5 is formed with the light dispersion region 8 and the light-transmissive region 9. The light dispersion region 8 occupies about 90 percent of the light dispersion layer 5.

Other layers were formed in the same way as in Example 1 to provide the organic EL device shown in FIG. 1 (*a*).

Example 3

Figure 4:
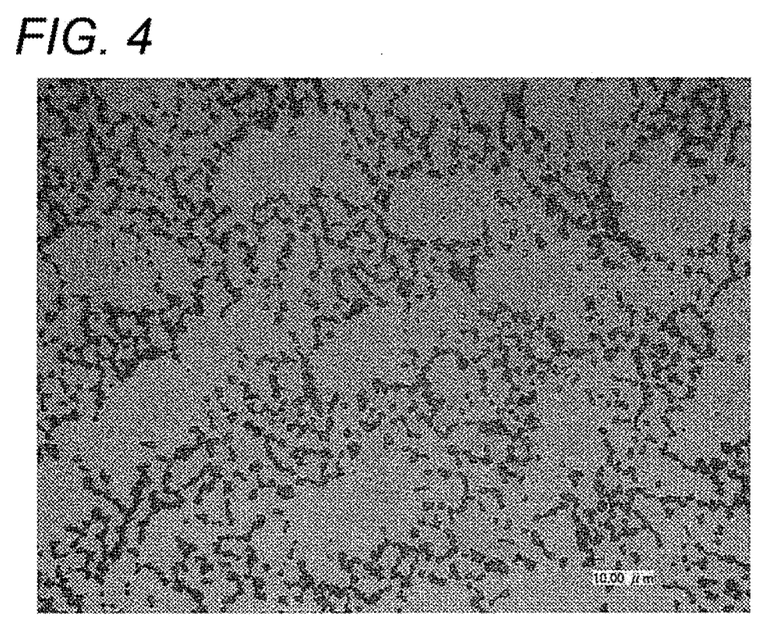
FIG. 4 shows an optical microscopic photograph of the light dispersion layer surface in example 3 of the organic EL device in the present invention, with 500-fold magnification.

The coating material was applied on the substrate 1 by spin-coater and then dried in the same way as in Example 1 only one time, so as to provide the light dispersion layer 5. Thickness of the light dispersion layer 5 was measured by using the contact surface profilometer (available from Japan Veeco Co. Ltd. as "DekTak3"). The mean thickness of the light dispersion layer 5 is about 1 μm. The surface of this light dispersion layer 5 was observed by using optical microscope (available from Keyence Co. Ltd. as "VHX-500"). FIG. 4 shows an optical microscopic photograph of the surface of this light dispersion layer 5, with 500-fold magnification. As shown in FIG. 4, the light-transmissive region 9 containing no light dispersion particles 6 almost wholly occupies the light dispersion layer 5, which contains only a fraction of the light dispersion region 8 filled with the aggregated light dispersion particles 6. The light dispersion layer 5 has a sea-islands structure, in which the light dispersion region 8 defines islands; a light-transmissive region 9 defines sea. The light dispersion region 8 forming each island has a dimension of 100 μm or less. The light dispersion region 8 occupies about 10 percent of the light dispersion layer 5.

Other layers were formed in the same way as in Example 1 to provide the organic EL device shown in FIG. 1 (*a*).

Example 4

A methylsilicone particle having a mean diameter of 60 μm was employed for the light dispersion particle 6. Other layers were formed in the same way as in Example 1 to provide the organic EL device shown in FIG. 1 (*a*).

Example 5

A methylsilicone particle having a mean diameter of 0.5 μm was employed for the light dispersion particle 6. Other layers were formed in the same way as in Example 1 to provide the organic EL device shown in FIG. 1 (*a*).

Example 6

A convex-lens shaped acryl resin particle (available from Sekisui Chemical Co. Ltd. as "L-XX-03N", mean diameter of 5 μm) was employed for the light dispersion particle 6. Other layers were formed in the same way as in Example 1 to provide the organic EL device shown in FIG. 1 (*a*).

Example 7

Al particle having a mean diameter of 6 μm was employed for the light dispersion particle 6. Other layers were formed in the same way as in Example 1 to provide the organic EL device shown in FIG. 1 (*a*).

Comparative Example 1

The light-transmissive substrate 1 was directly formed at its surface with ITO film by spattering, then subjected to heat treatment at 200° C. for one hour, and subsequently annealed to provide the electrode 3. The electrode 3 is directly formed thereon with the organic light emitting layer 2 and the opposing electrode 10 in the same way as in Example 1, then encapsulated with the sealing cap to provide the organic EL device.

Comparative Example 2

The coating material was applied on the substrate 1 by spin-coater in the same way as in Example 1 and dried repeatedly 14 times to provide the light dispersion layer 5. Other layers were formed in the same way as in Example 1 to provide the organic EL device.

The thickness of the light dispersion layer 5 was measured by using contact surface profilometer (available from Japan Veeco Co. Ltd. as "DekTak3"). The mean thickness of the light dispersion layer 5 is about 12 μm. The light dispersion particles 6 almost wholly occupy the light dispersion layer 5. The light dispersion layer 8 almost occupies about 98 percent of the light dispersion layer 5.

Comparative Example 3

The coating material was applied on the substrate 1 by spin-coater in the same way as in Example 1 only one time, with the spin coater being set to rotate at 4000 rpm, to provide the light dispersion layer 5. Other layers were formed in the same way as in Example 1 to provide the organic EL device.

The thickness of the light dispersion layer 5 was measured by using contact surface profilometer (available from Japan Veeco Co. Ltd. as "DekTak3"). The mean thickness of the light dispersion layer 5 is about 0.5 μm. The light dispersion region 8 occupies only a fraction of the light dispersion layer 5. The light-transmissive region 9 occupies about 98 percent of the light dispersion layer 5.

Electrical properties were obtained through measurement using a luminance meter (available from Topcon Corp.) for the organic EL devices in Examples 1 to 7 and comparative examples 1 to 3, in which electric current was supplied from a DC electric source (available from Keithley Instruments, Inc.) and maintained to flow at 10 mA/cm² inside these devices. Front luminance was measured in the angle range of −80 to +80 degrees with intervals of 10 degrees, together with electric current efficiency (cd/A), for being used to calculate total light flux (electric power efficiency in lm/W). Table 1 shows the obtained electric current efficiency and electric power efficiency with their relative efficiencies in relation to those in comparative reference 1. There is little difference in luminescence spectrum and relationship between electric current and voltage, among the devices in Examples 1 to 7 and comparative examples 1 to 3.

TABLE 1

|  | Light dispersion particle | Light dispersion region | Electrical current efficiency (cd/A) | Electric power efficiency (lm/W) |
|---|---|---|---|---|
| Example 1 | Spherical shaped particle 2 μm in diameter | ca. 70% | 11.2 1.4 times | 6.2 1.4 times |
| Example 2 | Spherical shaped particle 2 μm in diameter | ca. 90% | 11.0 1.4 times | 5.9 1.3 times |
| Example 3 | Spherical shaped particle 2 μm in diameter | ca. 10% | 9.5 1.2 times | 5.2 1.2 times |
| Example 4 | Spherical shaped particle 60 μm in diameter | ca. 70% | 9.4 1.2 times | 5.1 1.2 times |
| Example 5 | Spherical shaped particle 0.5 μm in diameter | ca. 70% | 9.9 1.2 times | 5.1 1.1 times |
| Example 6 | Non-circular shaped particle 6 μm in diameter | ca. 70% | 11.8 1.5 times | 6.6 1.5 times |
| Example 7 | Light-reflective non-circular shaped particle 6 μm in diameter | ca. 70% | 11.3 1.4 times | 6.3 1.4 times |
| Comparative example 1 | — | — | 8.1 — | 4.5 — |
| Comparative example 2 | Spherical shaped particle 2 μm in diameter | ca. 98% | 8.5 1.1 times | 4.8 1.1 times |
| Comparative example 3 | Spherical shaped particle 2 μm in diameter | ca. 2% | 8.1 1.0 times | 4.5 1.0 times |

Table 1 shows that each of the organic EL devices in Examples 1 to 7 provides improved light output, compared with those in comparative example 1 where light dispersion layer 5 is not provided, in comparative example 2 where the light dispersion region almost wholly occupies the light dispersion layer 5, and in comparative example 3 where the light-transmissive region almost wholly occupies the light dispersion layer 5.

The invention claimed is:

1. An organic electroluminescent device comprising;
   a light-transmissive substrate;
   an organic light emitting layer;
   a light-transmissive electrode disposed between said light-transmissive substrate and said organic light emitting layer; and
   a light guiding layer which is disposed between said substrate and said light-transmissive electrode, and configured to alter light direction;
   wherein said organic electroluminescent device is configured to emit light from said organic light emitting layer, and allow the light to propagate out through said light guiding layer, said light-transmissive electrode, and said light-transmissive substrate,
   wherein said light guiding layer includes a light dispersion layer,
   said light dispersion layer being formed with a light dispersion region and a light-transmissive region, which are arranged in a coplanar relation within said light dispersion layer,
   said light dispersion region containing light dispersion particles and a binder resin,
   said light-transmissive region containing said light dispersion particles at a lower ratio than said light dispersion region,
   wherein said light dispersion layer comprises a planar area which is parallel to the light-transmissive substrate and the organic light emitting layer, and
   wherein the coplanar relation of the light dispersion region and the light-transmissive region is defined as being in a same plane within said planar area.

2. The organic electroluminescent device as set forth in claim 1, wherein
   said light dispersion region occupies 10 to 90 percent of said planar area within said light dispersion layer.

3. The organic electroluminescent device as set forth in claim wherein
   said light dispersion layer has a sea-islands structure, in which one of said light dispersion region and said light-transmissive region defines a sea, and the other of said light dispersion region and said light-transmissive region defines an island, said island having a dimension of 1 to 100 μm.

4. The organic electroluminescent device as set forth in claim 2, wherein
   said light dispersion layer has a sea-islands structure, in which one of said light dispersion region and said light-transmissive region defines a sea, and the other of said light dispersion region and said light-transmissive region defines an island, said island having a dimension of 1 to 100 μm.

5. The organic electroluminescent device as set forth in any one of claims 1 to 3, and 4, wherein each of said light dispersion particles has a diameter of 0.05 to 100 μm.

6. The organic electroluminescent device as set forth in any one of claims 1 to 3, and 4, wherein each of said light dispersion particles is shaped into a non-circular configuration having a major axis and a minor axis.

7. The organic electroluminescent device as set forth in any one of claims 1 to 3, and 4, wherein each of said light dispersion particles is light-reflective.

8. The organic electroluminescent device as set forth in any one of claims 1 to 3, and 4, wherein
said light guiding layer is provided with a smoothing layer between said light dispersion layer and said light-transmissive electrode, and
wherein said smoothing layer is provided on a surface of said light dispersion layer and has a smooth surface.

9. The organic electroluminescent device as set forth in claim 5, wherein each of said light dispersion particles is shaped into a non-circular configuration having a major axis and a minor axis.

10. The organic electroluminescent device as set forth in claim 5, wherein each of said light dispersion particles is light-reflective.

11. The organic electroluminescent device as set forth in claim 6, wherein each of said light dispersion particles is light-reflective.

12. The organic electroluminescent device as set forth in claim 9, wherein each of said light dispersion particles is light-reflective.

13. The organic electroluminescent device as set forth in claim 5, wherein
said light guiding layer is provided with a smoothing layer between said light dispersion layer and said light-transmissive electrode, and
wherein said smoothing layer is provided on a surface of said light dispersion layer and has a smooth surface.

14. The organic electroluminescent device as set forth in claim 6, wherein
said light guiding layer is provided with a smoothing layer between said light dispersion layer and said light-transmissive electrode, and
wherein said smoothing layer is provided on a surface of said light dispersion layer and has a smooth surface.

15. The organic electroluminescent device as set forth in claim 7, wherein
said light guiding layer is provided with a smoothing layer between said light dispersion layer and said light-transmissive electrode, and
wherein said smoothing layer is provided on a surface of said light dispersion layer and has a smooth surface.

16. The organic electroluminescent device as set forth in claim 9, wherein
said light guiding layer is provided with a smoothing layer between said light dispersion layer and said light-transmissive electrode, and
wherein said smoothing layer is provided on a surface of said light dispersion layer and has a smooth surface.

17. The organic electroluminescent device as set forth in claim 10, wherein
said light guiding layer is provided with a smoothing layer between said light dispersion layer and said light-transmissive electrode, and
wherein said smoothing layer is provided on a surface of said light dispersion layer and has a smooth surface.

18. The organic electroluminescent device as set forth in claim 11, wherein
said light guiding layer is provided with a smoothing layer between said light dispersion layer and said light-transmissive electrode, and
wherein said smoothing layer is provided on a surface of said light dispersion layer and has a smooth surface.

19. The organic electroluminescent device as set forth in claim 12, wherein
said light guiding layer is provided with a smoothing layer between said light dispersion layer and said light-transmissive electrode, and
wherein said smoothing layer is provided on a surface of said light dispersion layer and has a smooth surface.

20. The organic electroluminescent device as set forth in claim 3,
wherein the light dispersion region defines a sea,
the light-transmissive region defines an island.

21. The organic electroluminescent device as set forth in claim 1, wherein the binder resin contains many aggregated light dispersion particles.

* * * * *

UNITED STATES PATENT AND TRADEMARK OFFICE
CERTIFICATE OF CORRECTION

| | | |
|---|---|---|
| PATENT NO. | : 8,530,916 B2 | Page 1 of 1 |
| APPLICATION NO. | : 12/673806 | |
| DATED | : September 10, 2013 | |
| INVENTOR(S) | : Masahiro Nakamura et al. | |

It is certified that error appears in the above-identified patent and that said Letters Patent is hereby corrected as shown below:

On the title page add the foreign priority data.

(30)   Foreign Application Priority Data**

Aug 27, 2007   (JP)................................ 2007-220299 **

Signed and Sealed this
Eighteenth Day of February, 2014

Michelle K. Lee
*Deputy Director of the United States Patent and Trademark Office*